United States Patent [19]

Iyogi et al.

[11] Patent Number: 4,835,344
[45] Date of Patent: May 30, 1989

[54] ELECTRONIC COMPONENT PARTS AND METHOD FOR MANUFACTURING THE SAME

[75] Inventors: Kiyoshi Iyogi; Takaaki Yasumoto, both of Kawasaki; Toshirou Yanazawa, Yokohama; Nobuo Iwase, Kamakura; Masako Nakahashi; Hiromitsu Takeda, both of Tokyo, all of Japan

[73] Assignee: Kabushiki Kaisha Toshiba, Kawasaki, Japan

[21] Appl. No.: 154,273

[22] Filed: Feb. 10, 1988

[30] Foreign Application Priority Data

Feb. 10, 1987 [JP] Japan ................ 62-27122
Apr. 24, 1987 [JP] Japan ................ 62-100050
Apr. 24, 1987 [JP] Japan ................ 62-100051
May 30, 1987 [JP] Japan ................ 62-136265

[51] Int. Cl.$^4$ .......... H05K 1/00; H01R 9/00; B23K 31/02
[52] U.S. Cl. .................. 174/68.5; 29/843; 228/122; 228/180.2
[58] Field of Search ........ 174/68.5; 228/122, 180.2; 29/842, 843

[56] References Cited

U.S. PATENT DOCUMENTS

| | | | |
|---|---|---|---|
| 4,471,026 | 9/1984 | Nicholas et al. | 228/122 X |
| 4,580,714 | 4/1986 | Mayer et al. | 228/122 X |
| 4,602,731 | 7/1986 | Dockus | 228/124 X |
| 4,621,761 | 11/1986 | Hammond et al. | 228/190 X |
| 4,645,117 | 2/1987 | Knapp et al. | 228/122 X |
| 4,665,468 | 5/1987 | Dohya | 174/68.5 X |
| 4,667,871 | 5/1987 | Mizuhara | 228/122 |
| 4,672,739 | 6/1987 | Churchwell et al. | 29/843 X |
| 4,679,960 | 7/1987 | Mizuhara | 228/154 X |
| 4,729,504 | 3/1988 | Edamura | 228/122 |
| 4,735,866 | 4/1988 | Moorhead | 228/122 X |

FOREIGN PATENT DOCUMENTS 56-163093 12/1981 Japan.

OTHER PUBLICATIONS

Magazine of "Electronics", Metal-Ceramic Brazed Seals; R. J. Bondley; p. 97, Jul., 1947.

Primary Examiner—Morris H. Nimmo
Attorney, Agent, or Firm—Oblon, Fisher, Spivak, McClelland & Maier

[57] ABSTRACT

The present invention provides an electronic component part with terminal pins very closely and very strongly bonded to a high thermal conductivity ceramics circuit board and a method for simply and continuously manufacturing electronic component parts, with a high operability, each with terminal pins bonded to a high thermal conductivity ceramics circuit board. According to the present invention, an electronic component part is provided in which terminal pins are bonded to a high thermal conductivity ceramics circuit board by a brazing metal, containing at least one kind of Group IVa elements. In another aspect of the present invention a method is provided for manufacturing electronic component parts, which comprises the step of attaching terminal pins to a high thermal conductivity ceramics circuit board by a brazing paste layer comprised of brazing metal powder containing at least one kind of Group IVa elements, an acrylic binder with a carboxylic group as a substituent group and organic solvent, and heating the resultant structure in an atmosphere containing nitrogen as a principal element so that terminal pins are firmly bonded to a circuit board.

15 Claims, 5 Drawing Sheets

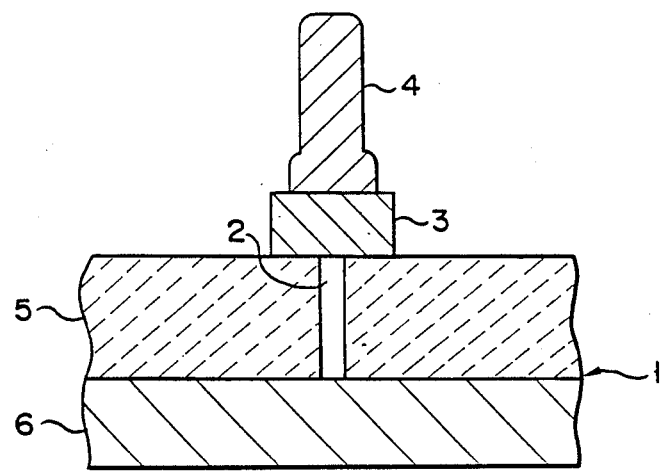
F I G. 1A
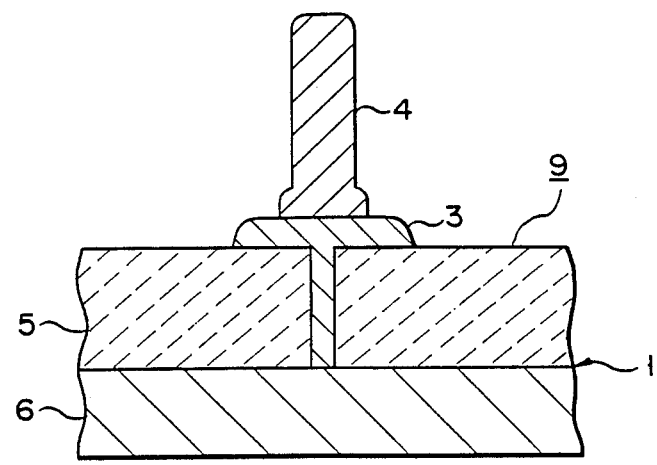
F I G. 1B

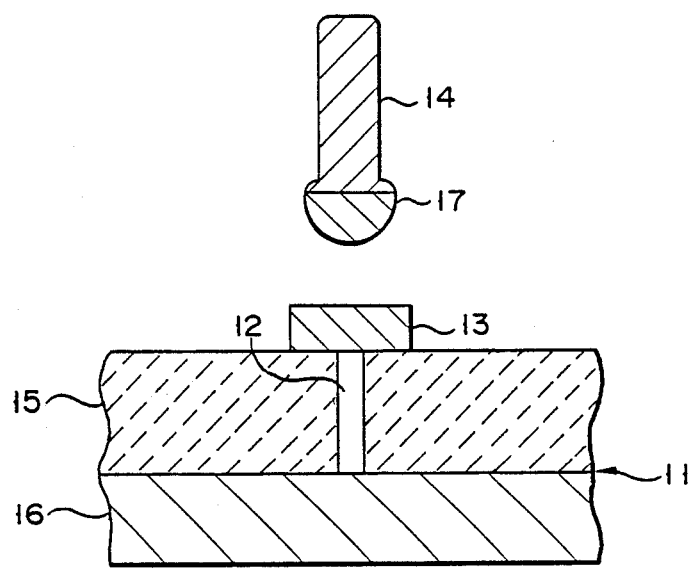
F I G. 2A
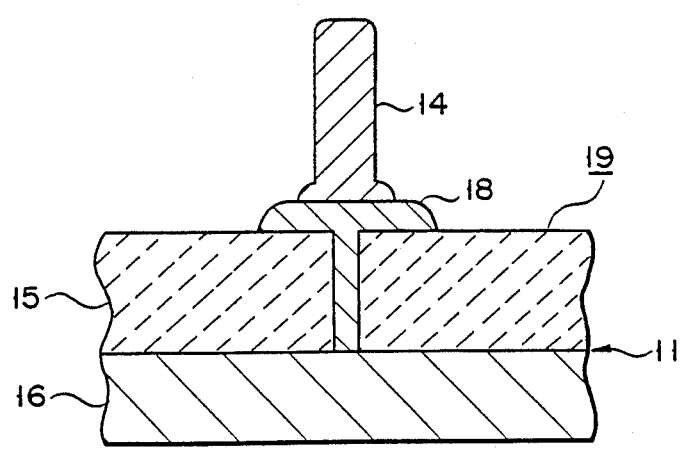
F I G. 2B

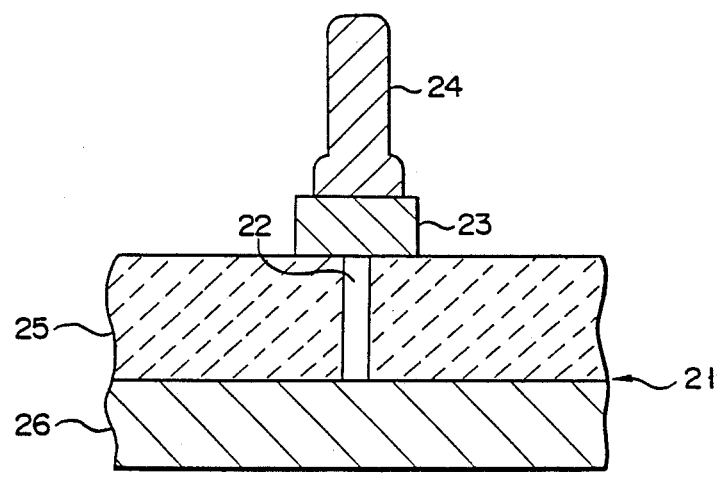
F I G. 3A
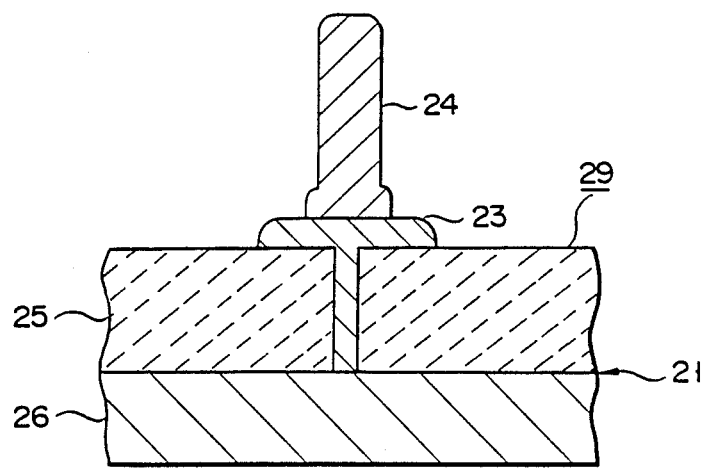
F I G. 3B

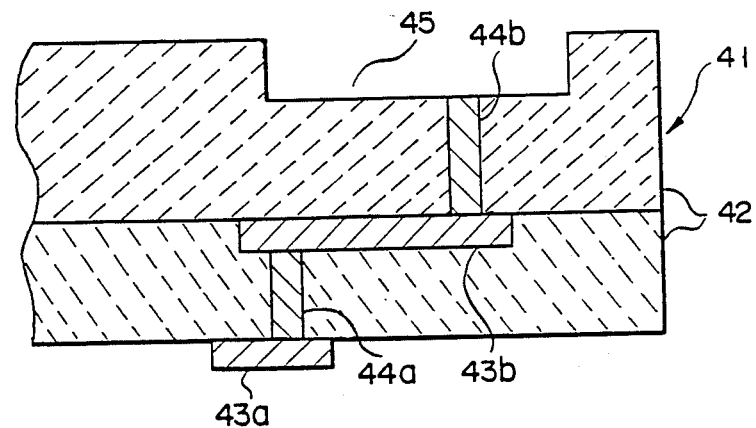
F I G. 5A
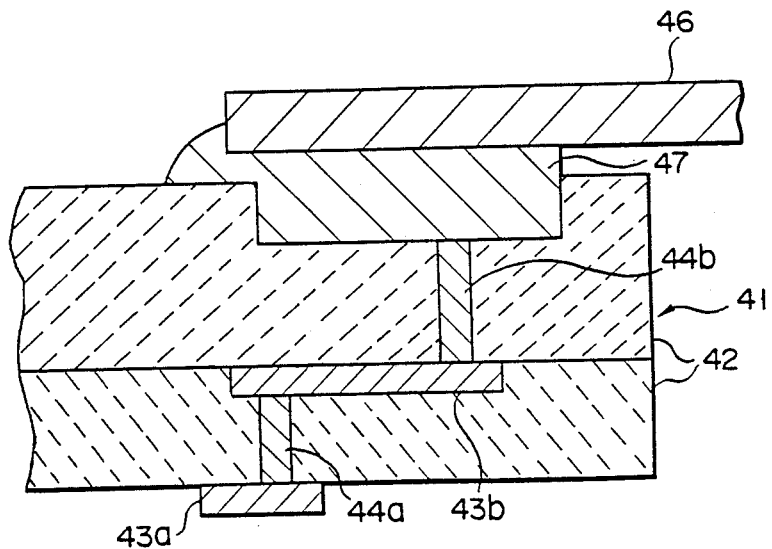
F I G. 5B

ELECTRONIC COMPONENT PARTS AND METHOD FOR MANUFACTURING THE SAME

BACKGROUND OF THE INVENTION

1. Field of the Invention

This invention relates to an electronic component part with high attaching strength between a ceramic substrate and terminal pin and with high operability, and the method of manufacturing the same.

2. Description of the Related Art Including Information Disclosed Under §§1.97–1.99:

Known are substrates, such as a resin substrate, metal substrate and ceramic substrate, on which a semiconductor device is formed. Of them, the ceramic substrate is excellent, in a general aspect, over other substrates in terms of its heat dissipation and insulating characteristics and its strength and is extensively employed in the art. Ceramic substrates excellent in their heat conductivity and heat dissipation have recently been developed and there are more and more demands for ceramics substrates.

In the application of the ceramic substrate to the electronic component parts, such as ceramic packages, it is necessary to attach, to a circuit board, terminal pins for external connection. With a recent high integration of semiconductor devices, the size of circuits to be incorporated becomes greater and greater with a corresponding larger increase in the number of terminal pins for the packages. Since a larger integration circuit or circuits are employed for a VLSI including logical circuits (logic VLSI: the number of gates, $G > 10^5$), for example, a larger number of terminal pins are connected to the package. For example, $P = 200$ to $300$ for $G = 10^5$. As a multi-terminal pin package use is most often made of semiconductor packages called pin grid array packages. For over 200 terminal pins as in VLSI's, however, the package has to be large-sized so as to arrange the terminal pins.

In order to maintain the conventional package size it will be necessary to arrange the pins in a high density with their size as small as possible in which case the pins have to be strong enough to be detachably connected to an external associated parts. It is also necessary to place the terminal pins in ohmic contact with the conductive layers of the ceramic substrate.

Since the logic VLSI device produces heat as large as 1 to 10 W at the time of operation, the thermal resistance should be made lower than 5° C./W.

As a package with better heat dissipation, attention has recently been paid to a ceramics package composed of Aluminum Nitride (AlN) or silicon Nitride (SiC) ceramic substrate of high thermal conductivity. The ceramic substrate thus employed has 5 to 10 times as great a thermal conductivity as that of the conventional $Al_2O_3$ (about 20 W/k·m) and is useful in view of its freedom from any toxicity as in Beryllium Oxide (BeO).

With high thermal conductivity ceramics, such as AlN and SiC, however, the wettability to the molten metal for connection to the pins is poorer than that of the conventional $Al_2O_3$, thus making it difficult to obtain a strong bond to metal terminal pins.

SUMMARY OF THE INVENTION

The present invention provides an electronic component part with terminal pins very closely and very strongly bonded to a high thermal conductivity ceramic circuit board and a method for simply and continuously manufacturing electronic component parts, with a high operability, each with terminal pins bonded to a high thermal conductivity ceramic circuit board.

According to the present invention, an electronic component part is provided in which terminal pins are bonded to a high thermal conductivity ceramic circuit board by a brazing metal, containing at least one kind of Group IVa elements. In another aspect of the present invention a method is provided for manufacturing electronic component parts, which comprises the step of attaching terminal pins to a high thermal conductivity ceramic circuit board by a brazing paste layer comprised of brazing metal powder containing at least one kind of Group IVa elements, an acrylic binder with a carboxylic group as a substituent group and organic solvent, and heating the resultant structure in an atmosphere containing nitrogen as a principal element so that terminal pins are firmly bonded to a circuit board.

As the high thermal conductivity ceramic circuit board as used in the present invention, use is made of, for example, (i) a single-layered ceramics circuit board obtained by printing the surface of a green sheet of a high thermal conductivity ceramic with the use of a metallized paste and sintering a resultant structure in a reducing atmosphere or a multi-layered circuit board obtained by printing wirings as a multi-layer structure with an insulating paste formed therebetween, and (ii) a multi-layered ceramic circuit obtained by forming a throughhole in a green sheet of a high thermal conductivity ceramic, printing a metallized paste in the surface of that green to allow the paste to be filled into the throughhole, forming wirings with an intervening insulating paste therebetween, and compression-bonding and sintering the resultant structure in a reducing atmosphere.

AlN, SiC, etc. are employed as a high thermal conductivity ceramic of which the green sheet is principally made. In the case of the AlN green sheet, use may be made of AlN snugly or one containing, as a sintering additive a rare earth element, such as Y, or an alkaline earth element, such as Ca.

The ceramic circuit board may be formed with a recess provided at an area of its bond with the terminal pin, in which case the recess may be formed at the step of preparing the aforementioned green sheet.

Group IVa elements contained in the brazing metal are Ti, Zr and Hf. In particular, a high activation Ti, Zr, or a combination of them is preferred. It is preferred that the weight percent of Group IVa element contained in the brazing metal be 2 to 15%. For less than 2% by weight of Group IVa element, poor wettability occurs at a bond between the ceramics and the brazing metal and, due to the agglomeration of the brazing metal, it is not possible to obtain a better bond of the terminal pins to the circuit board. For a weight percent of Group IVa element exceeding 15%, on the other hand, there is possibility that resistance will be increased at the bond as set out above or that an ohmic contact with the terminal pins will fall. More preferable weight percent of Group IVa element is in a range from less than 2% to 10%.

A Cu, Ni, Ag or other brazing metals are known, but a brazing metal containing Ag, Cu or Ag and Cu may be preferable in view of its low melting point and its better wettability with metal terminal pins. The brazing metal layer may be formed between the ceramics circuit board and the terminal pins by virtue of vapor deposition, sputtering, powder coating, paste coating, etc.

As an acrylic binder employed in a brazing paste, use may be made of, for example, a polyacrylic ester, and polymethacrylic ester, with a carboxylic group as a substituent group or a combination of part of each of these materials with styrene. The weight percent of the carboxylic group to be introduced as the substituent group into the binder is preferably in a range of from less than 1% to 5%. For less than 1% of the carboxylic group, the brazing metal powder is agglomerated in the binder, resulting in a poor bond with the ceramics board. For the weight percent of the carboxyl group exceeding 5%, the binder is liable to change into a gel and it becomes difficult to form a paste layer. It is preferably that the molecular weight of the acrylic binder be within a range of from 5000 to 15000. For the molecular weight of less than 5000, the paste shows a low bondability while, for the molecular weight exceeding 15000, more carbon remains at the bonded area after the structure has been heated at the bonding step so that a weak bond occurs between the brazing metal and the ceramic structure.

The amount of binder mixed is preferably within a range from less than 3 to 15 parts by weight relative to 100 parts by weight of the brazing metal powder. For the amount of the binder being less than 3 parts by weight, the paste is difficult to form. For the amount of the binder exceeding 15 parts by weight, a greater amount of carbon remains at the bonded area after the structure has been heated at the bonding step and a lower bondability is revealed at the area between the brazing metal and the ceramic structure. The amount of binder mixed is more preferably within a range of 5 to 10 parts by weight.

As an organic solvent employed for the brazing paste there are terepineol, diethyleneglycol, mono-n-butylether, etc.

The brazing paste layer may be formed on the side of the circuit board or the terminal pin or on the both sides of each of them. The brazing paste layer may be formed, for example, through the utilization of a screen printing.

The heating atmosphere is non-oxidizing atmosphere such as nitrogen, vacuum etc. Practically, the atmosphere containing nitrogen as a principal element is preferred. The content of impurity oxygen is preferably 20 ppm at most. Such an atmosphere can be obtained, for example, within a tunnel furnace. The heating step may be performed within the atmosphere, during the bonding process, at a temperature higher than the melting point of the brazing metal in the brazing paste. For example, 800° to 850° C. may be used as such in the case of brazing Ag.

According to the present invention it is possible to strongly braze the terminal pins to the ceramic of which the circuit board is made. The terminal pins can be attached to the circuit board by the brazing metal containing Group IVa element and the brazing metal is heated into a molten one so that, under the action of Group IVa element in the molten metal, the brazing metal is better wettable with the ceramic insulating layer of the circuit board. Where throughholes are formed in the circuit board, the molten brazing metal is penetrated in the throughholes so that the conductive layer deep down the throughholes is very strongly and ohmically bonded to the terminal pins by the brazing metal. It is therefore possible to obtain electronic component parts, such as ceramic packages (pin grid array packages), which are high in strength reliability and excellent in heat dissipation.

If a recess is formed at the bonded area in the circuit board and the resultant structure is heated with the terminal pin attached by the brazing metal to the recess, then the area of contact of the molten metal with the circuit board is increased, further improving the bond strength.

According to the present invention, use can be made of a coating means, such as a screen printing. If subsequent to attaching the terminal pins to the circuit board by the brazing paste the resultant structure is heated within the atmosphere containing nitrogen as a principal element, then the brazing metal of the paste becomes molten and the brazing metal is better wettable with the ceramic insulating layer of the circuit board under the action of Group IVa element in the molten metal. Because of the nitrogen-rich atmosphere it is possible to suppress the formation of an oxide film on the molten surface of the brazing metal so that the molten layer is formed with the terminal pins better attached to the circuit board. Furthermore, the acrylic binder in the paste is heated in the atmosphere containing the nitrogen as a main element and readily decomposed, thereby preventing the remaining of carbon which inhibits the wetting of the bonded area. It is possible to readily manufacture electronic component parts, such as ceramic packages, which are higher than the conventional counterparts in terms of their strength. Since the structure is not heated, under a vacuum atmosphere, at the time of bonding, the electronic component parts can be fabricated not only by a batch process but also by a continuous process, thereby enhancing high operability.

BRIEF DESCRIPTION OF THE DRAWINGS

FIGS. 1A and 1B are cross-sectional views showing a process of manufacturing a ceramic package according to a first embodiment of the present invention;

FIGS. 2A and 2B are cross-sectional views showing a process of manufacturing a ceramic package according to a second embodiment of the present invention;

FIGS. 3A and 3B are cross-sectional views showing a process of manufacturing a ceramic package according to a third embodiment of the present invention;

FIGS. 5A and 5B are cross-sectional views showing a process of manufacturing a ceramic package according to a fifth embodiment of the present invention.

DETAILED DESCRIPTION OF THE PREFERRED EMBODIMENTS

EXAMPLE 1

Figure 4A:
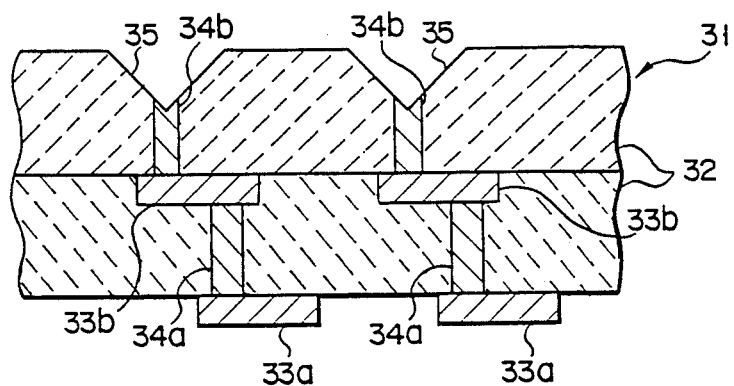
FIGS. 4A and 4B are cross-sectional views showing a process of manufacturing a ceramic package according to a fourth embodiment of the present invention.

In the pin attaching area located over throughhole 2 of an AlN multi-layered circuit board 1 comprised of insulating layer 5 and conductive layer 6, a brazing metal layer 3 of 1 mm in diameter×0.5 mm thick consisting of 5% of Ti, 68% of Ag and 27% of Cu was formed as shown in FIG. 1A, noting that the percent used here and below is all by weight. Then Ni 42%-F terminal pin 4 of 0.5 mm in diameter×3 mm long was held, by a carbon jig (not shown), in contact with metal brazing layer 3 on substrate without being displaced. In this state, the unit (board 1 and terminal pin 4) was placed within a vacuum furnace, not shown, and heated under a pressure of $5\times10^{-5}$ Torrs at 850° C. for three minutes. As a result, ceramic package 9 was manufactured with terminal pin 4 bonded by brazing metal layer 3 to board 1.

With package 9 thus obtained, the terminal pin was tested for tension and it has been found that the pin is not separated relative to board 1 under a load of 3 Kg and reveals a high bond strength. Upon measuring the conduction between the terminal pin 4 and conductor layer 6, by means of a tester, which is occupied within the throughhole below the central portion of the pin attachment area, a better ohmic contact has been confirmed. Furthermore, ceramic package 9 of Example 1 is as low as 5° to 6° C. during a rise in temperature at the time of operation as compared with the conventional ceramic package using $Al_2O_3$.

EXAMPLE 2

In the pin attaching area located over throughhole 12 of AlN multi-layered circuit board 11 comprised of insulating layer 15 and conductive layer 16, paste layer 13 of 1 mm in diameter×0.01 cm thick was formed which was comprised of powdered Ti or below 10 μm in particle size, organic binder (ethyl cellulose and ethanol mixture) and terpineol. On the other hand, 72% Ag/28% Cu brazing metal layer 17 was formed on the lower surface of Ni 42%-Fe terminal pin 14 of 0.5 mm in diameter×3 cm long.

Then metal brazing layer 17 of terminal pin 14 was held, by a carbon jig (not shown), in contact with paste layer 13 of board 11 without being displaced. In this state, the unit (substrate 11 and terminal pin 14) was placed within a vacuum furnace, not shown, and heated under a pressure of $5\times10^{-5}$ Torrs at 850° C. for 3 minutes. In this way, ceramic package 19 was manufactured, as shown in FIG. 2B, with terminal pin 14 bonded to board 11 by brazing metal/paste layer 18.

It has been confirmed that ceramic package 19 thus obtained manifests a high bonding strength, ohmic contact and heat dissipation as mentioned in Example 1.

EXAMPLE 3 a cermic package was manufactured in the same way as in Example 2, except that a brazing paste obtained by kneading 5% Ti/68% Ag/27% Cu alloy powder with an organic binder (acryl-based) and terepineol was coated at a rate of 1 mg/cm² on the lower end face of 42% Ni-Fe terminal pin of 0.5 mm in diameter×3 mm long.

Then in the pin attaching area located over a throughhole of an AlN multi-layered circuit board, the terminal pin was held, by a carbon jig, in contact with the brazing paste layer on the lower end face of the pin without being displaced. In this state, the resultant circuit board was placed within a vacuum furnace and heater under a pressure of $5\times10^{-5}$ Torrs at 850° C. for three minutes. Thus a ceramic package was manufactured with the terminal pin bonded to board by an activated brazing metal layer.

It has been confirmed that the ceramic package has a high bonding strength, ohmic contact and heat dissipation as mentioned in Examples 1 and 2.

EXAMPLE 4

Seven parts by weight of acrylic resin (acrylic ester polymer and copolymer of acrylic ester and methacrylic ester) with a 3% $NH_3$, OH or COOH group as a substituent group was mixed with 100 parts by weight of brazing metal powder consisting of 7% Ti, 67% Ag and 26% Cu. After being dissolved with terpineol, the respective mixture was kneaded within a mortar for 1 hour to prepare 6 kinds of brazing pastes.

Then in the pin attaching area located over throughhole 22 of AlN multi-layered circuit board 21 comprised of insulating layer 25 and conductive layer 26 as shown in FIG. 3A, a 200 μm-thick stainless screen, not shown, with a 1 mm-diameter printing section punched was placed in a superposing fashion. Then the respective brazing paste was cast on the screen, followed by printing and drying steps. Then the screen was removed to prepare brazing paste layer 23. 42% Ni-Fe terminal pin 24 was held, by a carbon jig (not shown), in contact with brazing paste layer 23 without being displaced. In this state, the resultant structure was placed within a tunnel furnace, not shown, and heated for 5 minutes at 850° C. in a gaseous $N_2$ atmosphere having an $O_2$ concentration of 16 ppm. Thus as shown in FIG. 3B, 6 kinds of ceramic packages 29 were manufactured with each terminal 24 bonded by brazing layer 23 to circuit board 21.

The respective ceramic package with the acrylic-based resin-containing brazing paste thus bonded was examined for wettability between the terminal pin and the circuit board, the result of which is shown in Table 1 with o and x showing "better" and "bad", respectively.

TABLE 1

| acrylic-based resin | substituent group | molecular weight | wettability |
|---|---|---|---|
| acrylic | —$NH_3$ | not measured | x |
| ester | —OH | not measured | x |
| polymer | —COOH | not measured | o |

TABLE 2

| acrylic-based resin | substituent group | molecular weight | wettability |
|---|---|---|---|
| copolymer of | —$NH_3$ | 160,000 | x |
| acrylic acid | —OH | 150,000 | x |
| and metacrylic acid | —COOH | 10,000 | o |

As appreciated from Table 1, the respective ceramic package with the $NH_3$ or OH substituent group-containing acrylic-based resin paste thus bonded reveals a bad wettability between the circuit board and the terminal pin. Upon examining the state of the brazing layer of the ceramic package, the metal powder was found agglomerated or granulated with the terminal pin loosely attached to the circuit board, failing to obtain any adequate bond strength. It has been observed that the carbon was partially deposited. In contrast, the ceramic package having a bonded paste containing the acrylic-based resin with the COOH group as a substituent group revealed a better wettability between the circuit board and the terminal pin. Upon measuring the strength of a bond of the pin to the circuit board by a tension tester of Instron Co., Ltd. Product (hereinafter called "Instron tension tester" ) it has been found that it was 6 Kgf/pin at min. and 9 Kgf/pin on the average, a very strong bond strength with a slight variation. In this case, the amount of carbon deposited on the surface of the brazing layer was less than one half that using the acrylic-based resin with the $NH_3$ or OH group as the substituent group. Upon measuring by a tester a resistance between the terminal pin and the portion of tungsten conductive layer 26 defined within the center portion of throughhole 22, an increase in resistance was 20 mΩ, that is, a value nearly equal to that involved in the case where the substrate was Ni-plated and the terminal pin is Ag-brazed to the board.

Furthermore, the ceramic package bonded by the paste containing the acrylic-based resin with the COOH group as the substituent group revealed a temperature rise of 5° to 6° C., that is, an excellent heat dissipation.

EXAMPLE 5

Three kinds of ceramic packages were manufactured with 42% Ni-Fe terminal pins bonded to an AlN multi-layered circuit board, in the same way as in Example 4, except that use was made of three kinds of brazing pastes prepared by mixing 100 parts by weight of brazing metal powder consisting of 7% Ti, 67% Ag and 26% Cu and 7 parts by weight of an acrylic-based resin with a portion of a copolymer of acrylic ester and methacrylic ester polymerized with styrene with a $NH_3$, OH or COOH group as a substituent group, dissolving the mixture with terpineol and kneading it within a mortar for 1 hour. The terminal pins and circuit board of the respective package were examined for their wettability, bond strength and heat dissipation as in Example 4 to obtain the same result for the ceramics package with each substituent as in Example 4.

EXAMPLE 6

Seven parts by eight of an acrylic-based resin with a COOH group as a substituent was mixed with 100 parts by weight of brazing metal powder consisting of 1, 2, 3, 5, 10 or 17% of Ti and a balance of Ag and Cu and, after being dissolved with terpineol, the mixture was kneaded within a mortar for 1 hour to prepare a brazing paste.

Then the same process as in Example 4 was performed to manufacture 6 kinds of ceramics packages. Of the packages obtained, a package having a bonded paste containing the brazing metal powder with 1% of Ti revealed poor wettability between the terminal pins and the circuit board and, due to the agglomeration of the brazing metal powder, a weak bond strength of 0 to 1 Kgf/pin. On the other hand, a package having a bonded paste containing brazing metal powder with 17% of Ti manifests a strong bond of the brazing mass to the circuit board. However, the terminal pin and a tungsten conductive layer defined deep down on the throughhole showed an increase of 50 to 200 mΩ with a larger variation. A package having a bonded brazing paste containing 2 to 10% of Ti showed better wettability between the circuit board and the terminal pin and, in this case, the strength of a bond of the terminal pins to the circuit board was 6 Kgf/pin at min. and 9 Kgf/pin (very strong) on the average with a small variation. The terminal pins and tungsten conductive layer defined deep down the center portion of the terminal pin attaching area were measured by a tester for their resistance and revealed a small increase of below 20 mΩ as compared with the case where after nickel has been plated on the board the terminal pins are Ag-based to the resultant structure.

EXAMPLE 7

One % of CaO and 3% of $Y_2O_3$ were added as a sinter additive to powdered AlN and polymethylacrylate was added as a binder to that mass to prepare a starting material. A 0.75 mm-thick green sheet was cut out by a doctor blade from the starting material. Then the green sheet with an outer edge was punched, by a punching blank mold for punching an outer diameter having a semicircular projection (5R) at both sides, to form a positioning recess at two places at both the sides of the green sheet. The green sheet was fixed to a guide pin-equipped jig with the positioning recesses as a reference and drilled by an NC drilling machine to provide a throughhole of 0.3 mm in diameter. Then a tungsten conductive paste was applied to the throughhole and around the edge thereof and a screen printing was performed.

Another green sheet was manufactured in the same way as set out above and superimposedon, and compression-bonded to, said another green sheet with their paste layers placed one over the other to provide a laminated sheet. A plurality of inverted frusto-conical recesses are formed by 1 mm-dia. drill on the pin attaching area of the green sheet laminated sheet.

The laminated green sheet, after being degreased, was fired in a reducing atmosphere to manufacture an AlN multi-layered circuit board as shown in FIG. 4A. Circuit board 31 comprises laminated AlN layers 32, first and second tungsten conductive layers 33a and 33b, first throughholes 34a filled with the tungsten conductive material for connection between conductive layers 33a and 33b, second throughholes 34b filled with the tungsten conductive material for connection between second conductive layer 33b and a "recess" side, and recesses 35.

Figure 4B:
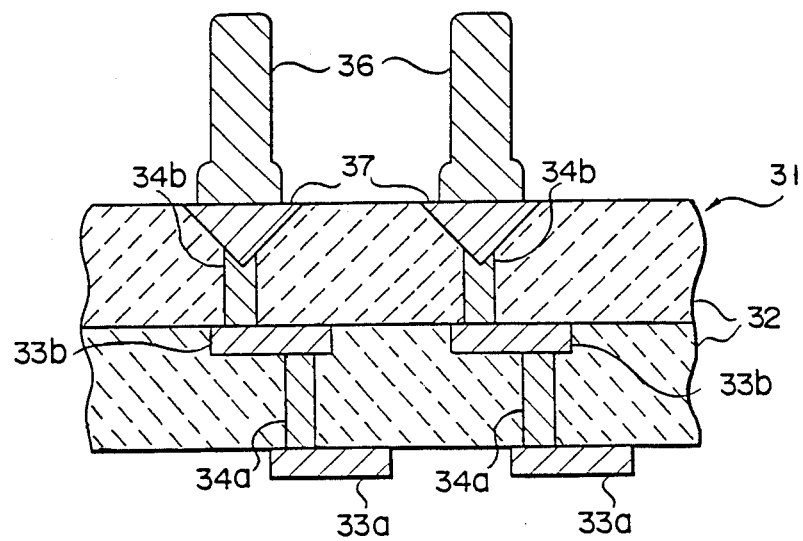

One hundred parts by weight of brazing metal powder consisting of 7% Ti, 67% Ag and 26% Cu was mixed with 7 parts by weight of acrylic ester with a COOH group as a substituent group and, after being dissolved with terpineol, kneaded within a mortar for 1 hour to prepare a brazing paste. Then a printing was made, by a 200 μm-thick stainless screen, not shown, with the use of a brazing paste and dried to form brazing paste layer 37 within recess 35. The resultant structure was placed within a tunnel furnace with the lower end portion of 42% Ni-F terminal pin 36 embedded with paste layer 37 by a carbon jig, not shown. Then the structure was heated in an $N_2$ gas atmosphere of a 16 ppm oxygen concentration level for 5 minutes at 850° C. to manufacture a ceramic package with terminal pin 36 bonded by brazing material 37 to board 31 as shown in FIG. 4B.

The package obtained produced less carbon deposit and better wettability was obtained at the bond of the terminal pin to the circuit board. The strength of the bond of the terminal pin to the circuit board, upon being measured by the Instron tension tester, showed 6 Kgf/pin at min. and a very great value of the order of 9 Kgf/pin on the average with a smaller variation. The terminal pin and tungsten conductive layer portion defined down the throughhole, upon being measured for their resistance, showed a small increase of below 20 mΩ as compared with the conventional Ni-plated circuit board with the terminal pin Ag-brazed thereto. It has been confirmed that there was no bad effect by the acrylic-based resin upon the interior of the brazing layer and that each terminal pin was in ohmic contact with the conductive layer of the throughhole.

It has also been confirmed that the ceramic package of this Example showed a low temperature rise of 5° to 6° C. as compared with that of the conventional package using $Al_2O_3$ and excellent heat dissipation.

EXAMPLE 8

A laminated green sheet was degreased and baked in a reducing atmosphere by the same method as in Example 7 to manufacture multi-layered AlN circuit board 41. Circuit board 41 is comprised of laminated AlN sheets 42, first and second tungsten conductive layers 43a and 43b formed on the surface and interior portion of one of sheets 42, first throughhole 44a filled with a tungsten conductive material for connection between conductive layers 43a and 43b, second throughhole 44b filled with the tungsten conduction material for connection between second conductive layer 43b and a "recess" side of AlN laminated sheet 42, and recess 45. Recess 45 is larger than the counterpart of the previous Example and is flat-bottomed. The side surface of the end portion of terminal pin 46 is bonded to board 41 by brazing layer 47.

The package obtained produced less carbon deposit and showed better wettability between the terminal pin and the circuit board. The strength of a bond of the terminal pin to the circuit board, upon being measured by the Instron tension tester, showed 6 Kgf/pin at min. and a very great value of the order of 9 Kgf/pin on the average with a slight variation. The terminal pin bonded by a brazing metal within the recess and tungsten conductive layer portion defined down the throughhole, upon being measured for their resistance thereacross, showed a small resistance increase of the order of less 20 m$\Omega$. It has been confirmed that there was no bad effect by the acrylic-based resin on the brazing layer and that each pin was in ohmic contact with the conductive portion within the throughhole.

It has also been confirmed that the ceramics package of this Example showed a temperature rise of 5° to 6° C., as well as an excellent heat dissipation, over the conventional $Al_2O_3$ package.

What is claimed is:

1. An electronic component part, comprising:
   (i) a high thermal conductivity ceramic circuit board including an insulating layer comprised of an AlN sintered body,
   (ii) terminal pins located over said circuit board, and
   (iii) a metal brazing material having 2 to 15 wt.% of at least one element selected from the Group IVa elements bonding said board and said pins.

2. The electronic component part according to claim 1, wherein said circuit board has a recess at a location at which a corresponding one of said terminal pins is bonded.

3. The electronic component part according to claim 1, wherein said metal brazing material is comprised of an alloy containing Ag and/or Cu as a principal element and 2 to 15% by weight of Ti, Zr or their combination.

4. The electronic component part according to claim 1, wherein said brazing material is comprised of Ag and/or Cu as a principal element and 2 to 10% by weight of Ti, Zr or their combination.

5. The electronic component part according to claim 1, wherein said brazing material is comprised of Ag as a principal element and 2 to 10% by weight of Ti or Zr.

6. A method for manufacturing an electronic component part, comprising the step of:
   (a) attaching terminal pins to a high thermal conductivity ceramic circuit board by a brazing paste layer consisting of a metal brazing powder containing at least one member of Group IVa elements, an acrylic binder with a carboxylic group as a substituent group, and an organic solvent; and
   (ii) heating the resultant structure to bond the pins to said circuit board.

7. The method according to claim 6, wherein said circuit board includes an insulating layer comprised of an aluminum nitride sintered body.

8. The method according to claim 6, wherein said circuit board includes a recess at its location where a corresponding one of said terminal pins is bonded.

9. The method according to claim 8, wherein said recess is formed at a step of forming a green sheet of ceramic.

10. The method according to claim 6, wherein said Group IVa elements are Ti, Zr or a combination thereof.

11. The method according to claim 6, wherein said metal brazing powder consists principally of Ag and/or Cu.

12. The method according to claim 6, wherein said carboxylic group is 1 to 5% by weight.

13. The method according to claim 6, wherein said acrylic binder has a molecular weight of 5000 to 15000.

14. The method according to claim 6, wherein said heating is performed substantially in a nitrogen gas atmosphere.

15. The method according to claim 6, wherein said atmosphere contains an impurity oxygen of below 20 ppm.

* * * * *